(12) United States Patent
Hsiao et al.

(10) Patent No.: US 6,920,620 B2
(45) Date of Patent: Jul. 19, 2005

(54) METHOD AND SYSTEM FOR CREATING TEST COMPONENT LAYOUTS

(75) Inventors: Hung-Lin Hsiao, Hsinchu (TW); Jui-Chien Wang, Hsinchu Hsien (TW)

(73) Assignee: Springsoft, Inc., Hsinchu (TW)

( * ) Notice: Subject to any disclaimer, the term of this patent is extended or adjusted under 35 U.S.C. 154(b) by 191 days.

(21) Appl. No.: 10/160,690

(22) Filed: May 31, 2002

(65) Prior Publication Data

US 2003/0135831 A1 Jul. 17, 2003

(30) Foreign Application Priority Data

Jan. 16, 2002 (TW) ........................ 91100574 A

(51) Int. Cl.$^7$ .................... G06F 17/50; G06F 9/455
(52) U.S. Cl. ........................................ 716/4; 716/11
(58) Field of Search .................. 716/2–5, 11

(56) References Cited

U.S. PATENT DOCUMENTS

| | | | | |
|---|---|---|---|---|
| 6,064,806 A | * | 5/2000 | Lakos et al. ................ | 716/11 |
| 6,341,366 B1 | * | 1/2002 | Wang et al. ................ | 716/11 |
| 6,457,163 B1 | * | 9/2002 | Yang ........................ | 716/5 |
| 6,480,995 B1 | * | 11/2002 | Schmidt et al. ............ | 716/11 |
| 6,523,162 B1 | * | 2/2003 | Agrawal et al. ........... | 716/11 |

* cited by examiner

Primary Examiner—Vuthe Siek
Assistant Examiner—Paul Dinh
(74) Attorney, Agent, or Firm—Smith-Hill and Bedell

(57) ABSTRACT

In a computer-implemented method and system for creating a test component layout, after creating a reference component layout that is composed of a set of polygonal working shapes, a plurality of shape parameters are defined for the working shapes of the reference component layout, and a parameter template is formed based on the shape parameters of the reference component layout. Thereafter, user-defined distance values corresponding to the shape parameters may be inputted into the parameter template, and the test component layout is automatically created by adjusting geometry of the working shapes of the reference component layout with reference to the user-defined distance values inputted into the parameter template.

28 Claims, 7 Drawing Sheets

| TYPE | VARIABLE | VALUE |
|---|---|---|
| VARIABLE | P1 | 0.4 |
| VARIABLE | P2 | 0.15 |
| VARIABLE | P3 | 0.15 |
| VARIABLE | P4 | 0.15 |
| VARIABLE | P5 | 0.25 |
| VARIABLE | P6 | 0.4 |

| PARAMETER | DEFINITION | VALUE |
|---|---|---|
| D1 | $P1 | 0.4 |
| D2 | $P2 | 0.15 |
| D3 | $P2 | 0.15 |
| D4 | $P2 | 0.15 |
| D5 | $P2 | 0.15 |
| D6 | $P4 | 0.15 |
| D7 | $P3 | 0.15 |
| D8 | $D6+$D2+$D1+$D4+$D7 | 1.0 |
| D9 | $P5 | 0.25 |
| D10 | $P6 | 0.4 |

FIG. 8

| VARIABLE/PARAMETER | FIRST VALUE | NUMERICAL VALUES |
|---|---|---|
| P1 | 0.4 | 0.4 |
| P2 | 0.1 | 0.1 |
| P3 | 0.1 | 0.1 |
| P4 | 0.1 | 0.1 |
| P5 | 0.25 | 0.25 |
| P6 | 0.35 | 0.35 |
| D1 | 0.35 | (0.35:0.45:0.05) |
| D2 | 0.1 | 0.1 |
| D3 | 0.1 | (0.1:0.12:0.01) |
| D4 | 0.1 | 0.1 |
| D5 | 0.1 | 0.1 |
| D6 | 0.1 | 0.1 |
| D7 | 0.1 | 0.1 |
| D8 | 0.75 | $D6+$D2+$D1+$D4+$D7 |
| D9 | 0.1 | 0.1 |
| D10 | 0.26 | (0.26:0.32:0.02) (0.33:0.37:0.01) (0.38:0.42:0.02) |

FIG. 9

PMOS
Gate_L=0.28
CONT_W=0.35
CO_M1_E_T=0.10

# METHOD AND SYSTEM FOR CREATING TEST COMPONENT LAYOUTS

CROSS-REFERENCE TO RELATED APPLICATION

This application claims priority of Taiwan Patent Application No. 091100574, filed on Jan. 16, 2002.

BACKGROUND OF THE INVENTION

1. Field of the Invention

The invention relates to the creation of test component layouts, more particularly to a computer-implemented method and system for the automated creation of test component layouts.

2. Description of the Related Art

The production of integrated circuit can be divided into an integrated circuit design phase and an integrated circuit fabrication phase. Design rules provided by the relevant manufacturing technology should be followed during the design phase. However, in view of factors, such as actual operating environment and know-how, unique to each semiconductor manufacturer, even for identical fabrication technology, such as 0.15-micron fabrication technology, each semiconductor manufacturer generally requires a distinct set of design rules that should be followed during the integrated circuit design phase.

Semiconductor manufacturers must perform component characteristic analysis for different test components, such as MOS and CMOS transistors, etc., to determine design conditions for different fabrication technologies. To this end, the semiconductor manufacturer must first prepare test component layouts before proceeding with test component fabrication according to the layouts for performing component characteristic analysis. In order to increase the accuracy of component characteristic analysis, test component layouts having different sizes of working shapes and/or different distances among the working shapes must be prepared. For example, in a MOS transistor, the length of the gate electrode, the sizes of the contacts of the source and drain electrodes, the distance between the source and gate electrodes, the distance between the gate and drain electrodes, etc., may vary for different test components.

Computer-aided tools for computer-assisted drawing of individual test component layouts are known in the art. However, layout preparation using the known computer-aided tools is tedious, inefficient and prone to human error when applied to the preparation of test component layouts for different fabrication technologies. In addition, no means is provided to filter out these errors during the preparation of the test component layouts. Thus, there is no doubt that the conventional method is a very heavy burden to semiconductor manufacturers. Besides, whenever there is a new development in fabrication technology, semiconductor manufacturers are forced to prepare new layouts to perform component characteristic analysis for different sizes of test components. These tasks require a lot of manpower and time to complete. Not only is the manufacturing cost increased, any delay in design rule throughput will place the semiconductor manufacturer at a disadvantage with other manufacturers and can result in loss of ability to compete in the market.

In summary, how preparation of test component layouts for fabrication can be shortened is always a major concern of all semiconductor manufacturers. It is noted that, for the same type of test component, the layouts thereof for different fabrication technologies vary primarily in the dimensions of the working shapes. Therefore, this invention aims to automate the conventional tedious method of preparing new test component layouts by using resources available from previous layouts, which may be for older fabrication technologies. The invention not only reduces human error to a minimum, but also provides an excellent control environment to reduce manufacturing cost and time.

SUMMARY OF THE INVENTION

Therefore, the object of the present invention is to provide a computer-implemented method and system for the automated creation of test component layouts that can effectively shorten the time required to make new test component layouts for different fabrication technologies, thereby resulting in reduced manufacturing costs.

According to one aspect of the invention, there is provided a computer-implemented method for creating a test component layout, which comprises the steps of:

a) creating a reference component layout that is composed of a set of polygonal working shapes;

b) defining a plurality of shape parameters for the working shapes of the reference component layout;

c) forming a parameter template based on the shape parameters of the reference component layout;

d) inputting user-defined distance values corresponding to the shape parameters into the parameter template; and e) automatically creating the test component layout that is shown on a computer monitor by adjusting geometry of the working shapes of the reference component layout with reference to the user-defined distance values inputted into the parameter template.

According to another aspect of the invention, there is provided a system for creating a test component layout, which comprises:

a monitor for showing the test component layout thereon;

a template generator connected to the monitor and operable so as to form a parameter template based on a plurality of shape parameters that are defined for a set of polygonal working shapes which constitute a reference component layout;

an input unit connected to the template generator and operable so as to input user-defined distance values corresponding to the shape parameters into the parameter template; and a test layout generator connected to the monitor, the input unit and the template generator for automatically creating the test component layout that is shown on the monitor by adjusting geometry of the working shapes of the reference component layout with reference to the user-defined distance values inputted into the parameter template.

BRIEF DESCRIPTION OF THE DRAWINGS

Other features and advantages of the present invention will become apparent in the following detailed description of the preferred embodiment with reference to the accompanying drawings, of which:

FIG. 8 is a table showing the shape parameters of the layout of FIG. 7, the definitions of the shape parameters, and exemplary numerical values therefor;

FIG. 9 is a table showing how a parameter template is configured for the automated creation of a set of test component layouts according to the preferred embodiment;

DETAILED DESCRIPTION OF THE PREFERRED EMBODIMENT

Figure 1:
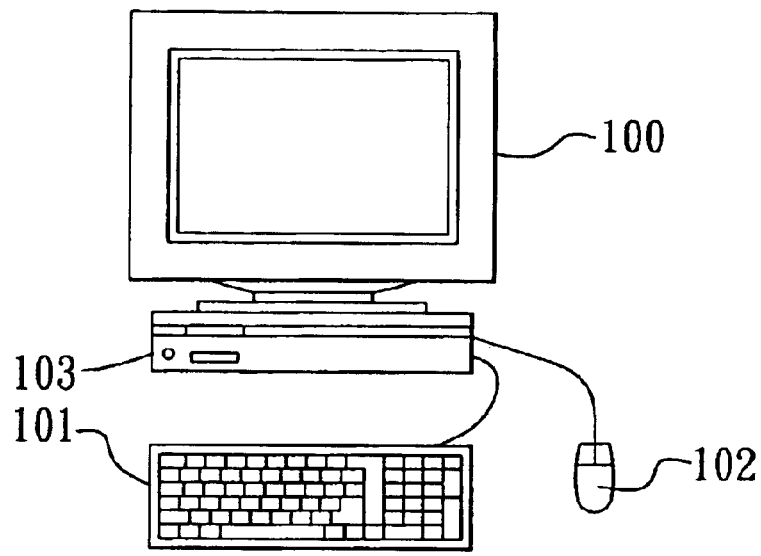
FIG. 1 illustrates an exemplary CAD workstation where the method and system of the present invention reside.

Referring to FIG. 1, the preferred embodiment of a computer-implemented method according to the present invention is implemented within a CAD environment and typically resides in an electronic data storage medium inside a CAD workstation. The CAD workstation houses various CAD tools for electronic circuit synthesis, electronic circuit simulation, electronic circuit layout design, etc. The CAD workstation comprises a monitor 100, a keyboard 101, a mouse 102 and a cabinet 103. There are many components on the cabinet 103, such as a floppy disk drive, a CD-ROM drive, a hard disk drive, processors, and memory. CAD tools, in which the method of this invention is incorporated, can be stored in and retrieved from among the different storage devices during use.

Figure 2:
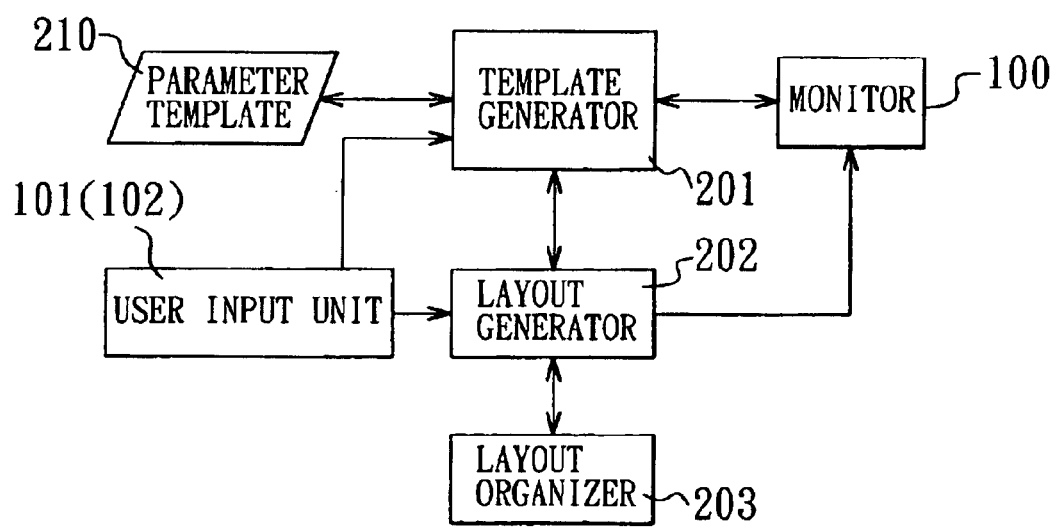
FIG. 2 is a block diagram to illustrate the system of the preferred embodiment.

Referring to FIG. 2, when the CAD workstation of FIG. 1 implements the method of the present invention, the processing system thereof will be configured to include a template generator 201, a layout generator 202, and a layout organizer 203, the purposes of which will be described in greater detail in the succeeding paragraphs.

Figure 3:
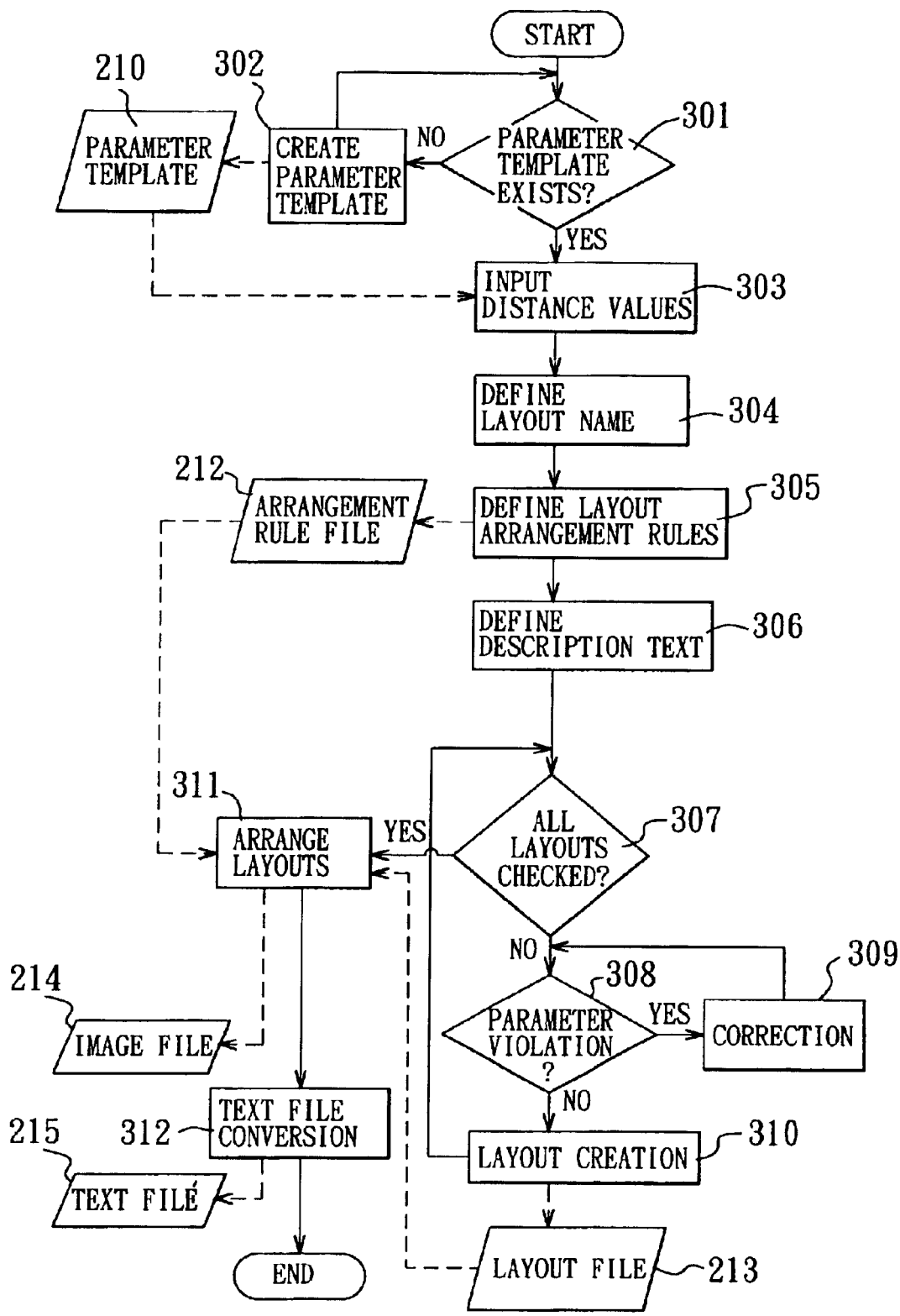
FIG. 3 is a flow diagram to illustrate the method of the preferred embodiment.

FIG. 3 is a flow diagram illustrating the method of the preferred embodiment. The method begins in step 301, where it is determined whether a desired parameter template 210 already exists. The parameter template 210 is one previously created by the template generator 201 for a reference component layout of a test component, such as a MOS or CMOS component. In general, a test component layout is composed of a set of polygonal working shapes. Upon establishing the parameter template 210, it is stored in the storage medium of the CAD workstation. If it is determined in step 301 that the parameter template 210 already exists, the parameter template 210 is retrieved and shown on the monitor 100 for the user's reference, and the flow goes directly to step 303. The shape parameters defined in the parameter template 210 include one- or two-dimensional width rules for two opposite edges of a working shape or for adjacent edges of two neighboring working shapes.

If it is determined in step 301 that the parameter template 210 does not exist, the flow proceeds to step 302, where the parameter template 210 is created using the template generator 201. This will be described in greater detail in the succeeding paragraphs.

In step 303, the user inputs user-defined distance values for the shape parameters of the parameter template 210 with the use of the keyboard 101 and the mouse 102, which constitute a user input unit. The distance values may be a numerical value or a numerical range set, which will be explained in greater detail in the succeeding paragraphs.

Figure 11:
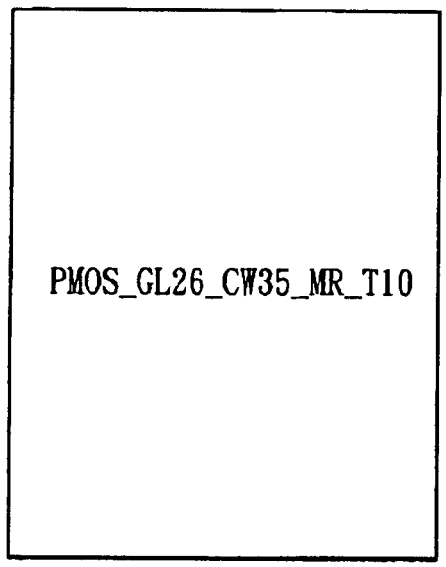
FIG. 11 illustrates one of the layouts in the set of FIG. 10 with a layout name associated therewith.

Thereafter, in step 304, through the layout generator 202, the user has the option of defining a layout name for each test component layout to be created to facilitate layout identification, as shown in FIG. 11.

Subsequently, in step 305, through the layout generator 203, the user has the option of defining layout arrangement rules that relate to the arrangement of the test component layouts to be created and shown on the monitor 100, e.g. the numbers of layouts per row, the distance between adjacent layouts in a row, the distance between adjacent columns of layouts, etc. The layout arrangement rules are then stored in the form of an arrangement rule file 212. It should be noted that, if an existing arrangement rule file 212 is selected, this step is omitted.

Figure 12:
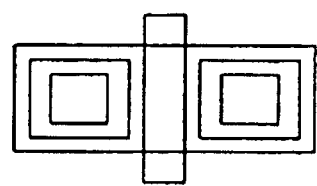
FIG. 12 illustrates a selected test component layout and its associated description text.

Next, in step 306, through the layout generator 202, the user can optionally define a description text for each test component layout to describe its layout characteristics. In this embodiment, the description text is shown below the corresponding test component layout, as shown in FIG. 12. Since this step is simply directed to ease layout recognition, it can be omitted in practice.

Thereafter, in step 307, the layout generator 202 determines if each test component layout to be created in accordance with the user-defined distance values inputted in step 303 has been checked. If yes, the flow goes to step 311. Otherwise, the flow goes to step 308.

In step 308, the layout generator 202 verifies if the user-defined distance values violate definitions of the shape parameters found in the parameter template 210. If no violation was detected, the flow goes to step 310. Otherwise, the flow goes to step 309.

In step 309, through the layout generator 202, the user is allowed to make appropriate corrections via the template generator 201 to ensure compliance of the user-defined distance values with the definitions of the shape parameters. The flow then goes back to step 308.

In step 310, the layout generator 202 automatically creates at least one test component layout that is to be shown on the monitor 100 by adjusting geometry of the working shapes of the reference component layout corresponding to the parameter template 210 in accordance with the distance values inputted into the parameter template 210. Each test component layout is stored in the form of a layout file 213. The flow then goes back to step 307.

Figure 10:
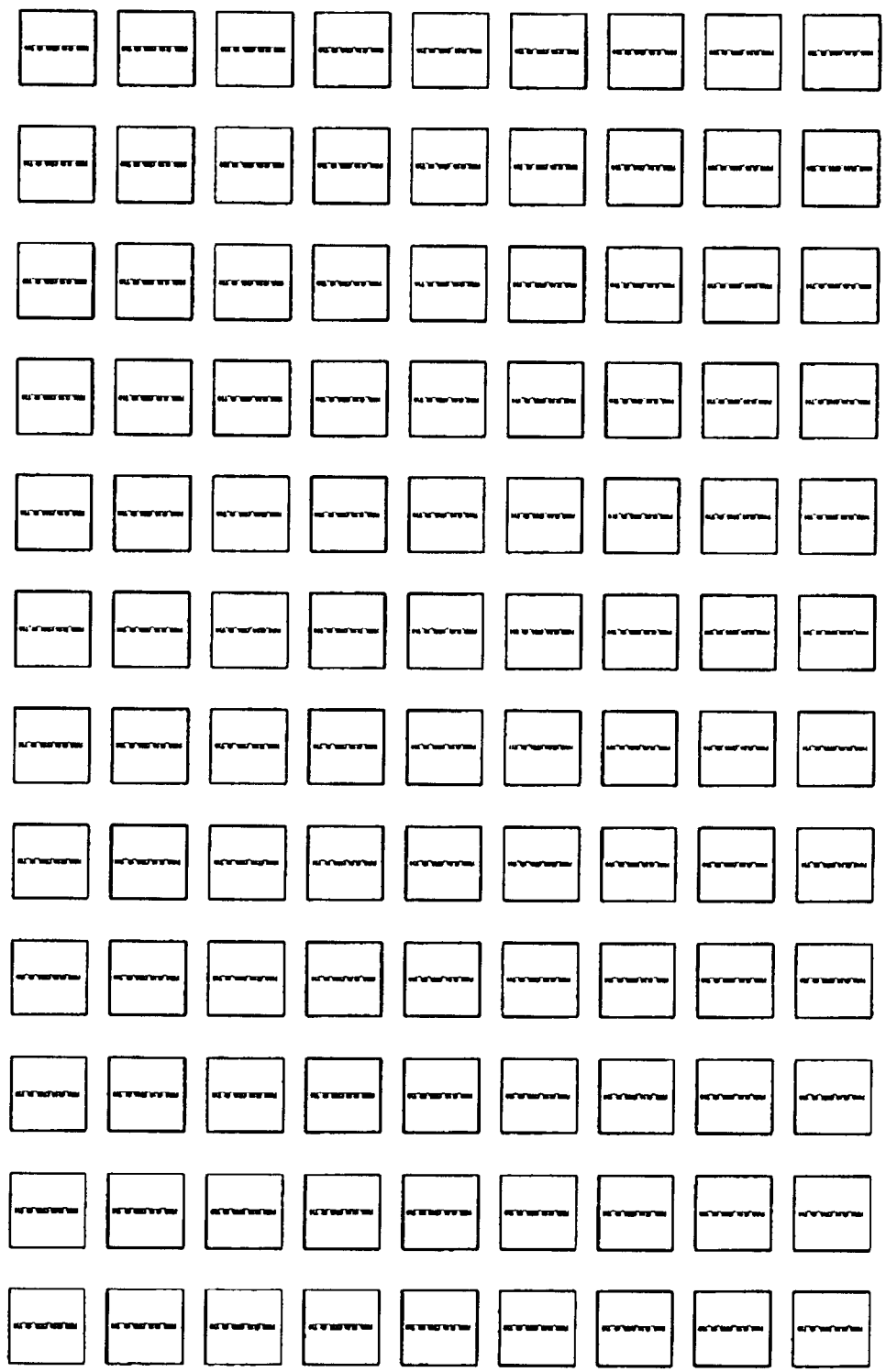
FIG. 10 illustrates the set of test component layouts in a user-defined arrangement.

In step 311, through the layout organizer 203, the newly created layout files 213 are retrieved and are shown on the monitor 100 in an arrangement that is in accord with the arrangement rule file 212, as shown in FIG. 10. The layout files 213 are stored as an image file 214.

Finally, in step 312, the test component layouts created by the layout generator 202 can be optionally converted by the layout generator 202 into a text file 215, which contains textual information of the material, use and coordinates of the working shapes, and which can be used for in-depth understanding of the test component layout and for subsequent parameter simulation analysis.

Figure 4:
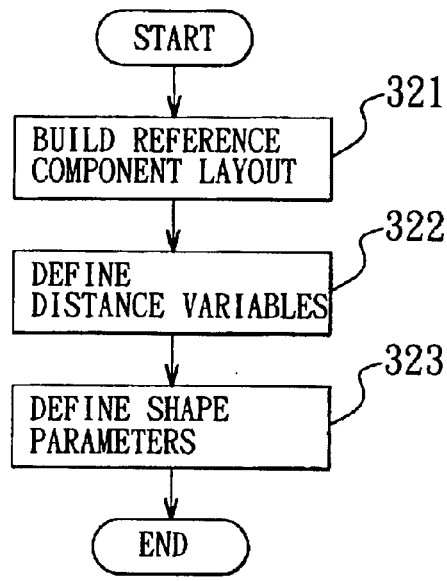
FIG. 4 is a flowchart to illustrate how a parameter template is created in the preferred embodiment.

FIG. 4 illustrates how a parameter template 210 is created using the template generator 201. First, in step 321, a reference component layout of a reference test component is established in a known manner, wherein the reference component layout is composed of a set of polygonal working shapes. Then, in step 322, distance variables, such as the one- or two-dimensional widths of selected working shapes, the enclosing distance between two selected working shapes, the extending distance between two selected working shapes, etc., may be defined for the reference component layout. The purpose of the distance variables will be apparent in the following description. Next, in step 323, shape parameters, such as the distance between opposing edges of one of the working shapes and the distance between adjacent edges of a neighboring pair of the working shapes, for the reference component layout are defined. The shape parameters may be defined in terms of the distance variables. Moreover, some of the shape parameters maybe used to define the widths of the working shapes in the layout, and others may be used to define the distance between adjacent edges of a neighboring pair of the working shapes of the layout. Once these shape parameters are fully defined, the method of this invention can adjust the sizes of the working shapes in the reference component layout according to user-defined distance values. Thus, the creation of test component layouts is automated and does away with the tedious task of redrawing as required in the prior art. Furthermore, when defining a shape parameter, the user first has to select two opposite edges corresponding to the parameter via the user input unit 101 or 102, and a ruler and a corresponding label are shown on the monitor 100 between the edges that are associated with that parameter.

Figure 5:
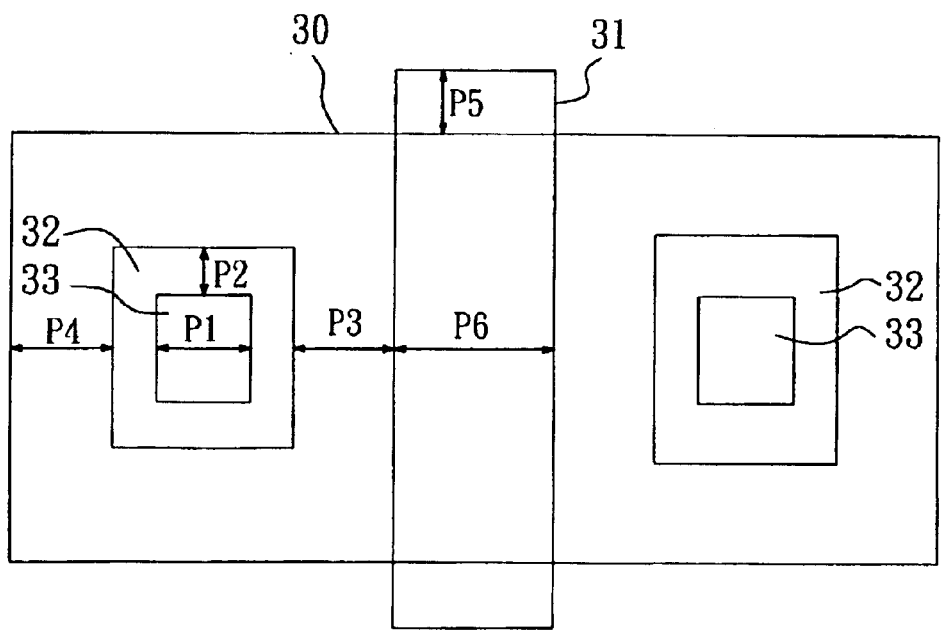
FIG. 5 illustrates an exemplary MOS transistor layout with distance variables defined therein.

To facilitate understanding of the steps in FIG. 4, a test component layout for a MOS component is shown in FIG. 5. First, a parameter template of the test component layout should be built. As described in step 321 of FIG. 4, a layout of the MOS component is drawn and is shown to comprise a thin oxide layer shape 30 and a poly layer shape 31 overlapping the shape 30 to serve as a gate of the MOS component. Two metal layer shapes 32 are respectively disposed on the left and right sides of the shape 31 and within the shape 30. The shapes 32 do not overlap the shape 31. A contact shape 33 is disposed in each shape 32.

Figures 6, 7:
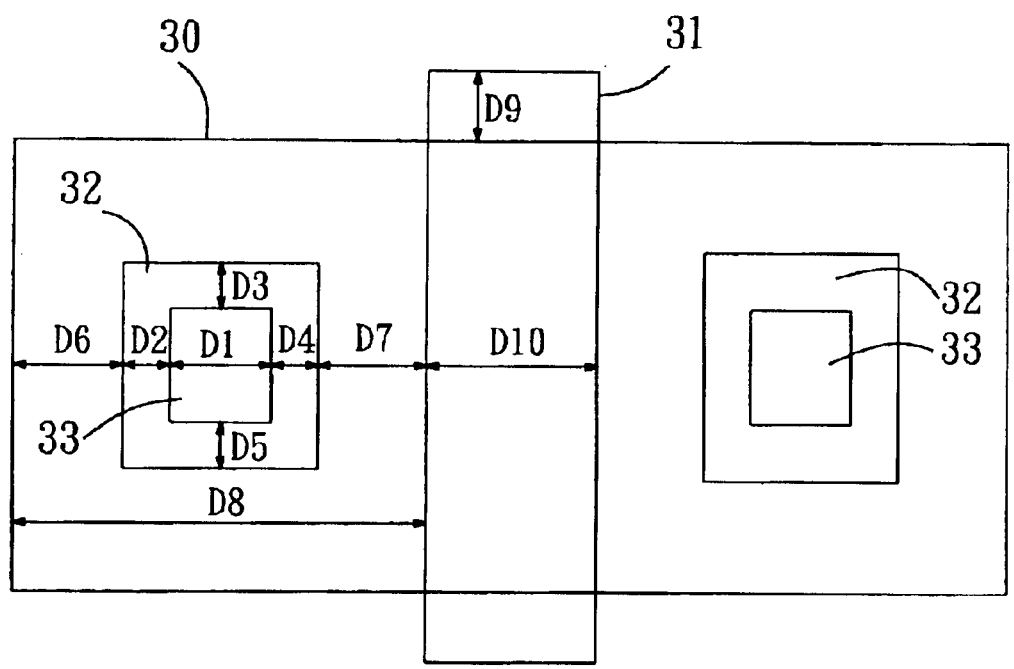
FIG. 6 is a table showing the distance variables of the layout of FIG. 5 and exemplary numerical values therefor.
FIG. 7 illustrates an exemplary MOS transistor layout with shape parameters defined therein.

Then, in step 322 of FIG. 4, distance variables of the test component layout are defined. In the example of FIG. 4, all of the working shapes 30, 31, 32 and 33 are rectangles. The shape 33 has a dimension represented by a distance variable P1 having a variable default value set to 0.4. The enclosing peripheral distance between the shape 33 and the shape 32 is represented by a distance variable P2 having a variable default value set to 0.15. The distance between the shape 32 and the shape 31 is represented by a distance variable P3 having a variable default value set to 0.15. The enclosing peripheral distance between the shape 30 and the shape 32 is represented by a distance variable P4. The extending distance of the shape 31 relative to the shape 30 is represented by a distance variable P5. Distance variables P4 and P5 have variable default values set to 0.15 and 0.25, respectively. The width of the shape 31 is represented by a distance variable P6 having a variable default value set to 0.4. FIG. 6 is a table showing the different distance variables P1–P6 and their default values. The distance variables P1–P6 are preferably variables that may be applied to different working shapes in the layout. For example, the distance variable P1 is applicable to the different contact shapes in the layout. With the use of the distance variables P1–P6, the input of user-defined distance values may be simplified during the automated creation of test component layouts. This will be apparent in the following paragraphs.

Next, in step 323 of FIG. 4 and with further reference to FIGS. 7 and 8, shape parameters between opposite edges of a working shape and between working shapes are defined in terms of the distance variables or as a function of other ones of the shape parameters. As shown in FIG. 7, the shape 33 is represented by a shape parameter D1 that is equal to the distance variable P1. The shape parameter D1 thus has a variable default value of 0.4. The distance between the left edge of the shape 33 and the left edge of the shape 32 is represented by a shape parameter D2 that is equal to the distance variable P2. The shape parameter D2 thus has a variable default value of 0.15. The distance between the top edge of the shape 33 and the top edge of the shape 32 is represented by a shape parameter D3 that is equal to the distance variable P2. The shape parameter D3 thus has a variable default value of 0.15. The distance between the right edge of the shape 33 and the right edge of the shape 32 is represented by a shape parameter D4 that is equal to the distance variable P2. The shape parameter D4 thus has a variable default value of 0.15. The distance between the bottom edge of the shape 33 and the bottom edge of the shape 32 is represented by a shape parameter D5 that is equal to the distance variable P2. The shape parameter D5 thus has a variable default value of 0.15. The distance between the left edge of the shape 30 and the left edge of the shape 32 is represented by a shape parameter D6 that is equal to the distance variable P4. The shape parameter D6 thus has a variable default value of 0.15. The distance between the right edge of the shape 32 and the right edge of the shape 31 is represented by a shape parameter D7 that is equal to the distance variable P3. The shape parameter D7 thus has a variable default value of 0.15. The distance between the left edge of the shape 30 and the left edge of the shape 31 is represented by a shape parameter D8 that is equal to D6+D2+D1+D4+D7. The shape parameter D8 has a variable default value of 1. The distance between the top edge of the shape 31 and the top edge of the shape 30 is represented by a shape parameter D9 that is equal to the distance variable P5. The shape parameter D9 thus has a variable default value of 0.25. The distance between the left and right opposite edges of the shape 31 is represented by a shape parameter D10 that is equal to the distance variable P6. The shape parameter D10 thus has a variable default value of 0.4. When this step 323 is finished, the parameter template 210 is built.

It should be noted that the rulers associated with the various shape parameters shown simultaneously in FIG. 7 are only for illustrative purpose. In practice, only one ruler of a shape parameter selected for editing will be shown. There are no rulers for the distance variables, which are merely used to simplify the input of the user-defined distance values. After editing, when the user moves the cursor via the user input unit 101 or 102 on the layout to a position corresponding to a parameter in the table of FIG. 8, this parameter will be represented by its label and shown on the monitor 100 together with the ruler to facilitate the user.

Thereafter, the layout generator 202 can be used to generate the requisite test component layouts. With further reference to FIG. 9, user-defined distance values can be input for the distance variables and shape parameters using the user input unit 101 or 102. As mentioned beforehand, each of the user-defined distance values may be a numerical value, like P1, P2, P3, P4, P5, P6, D2, D4, D5, D6, D7, D8 and D9, or a numerical range set that includes a lower limit, an upper limit and a step value to result in a set of numerical values between the lower and upper limits. For instance, the lower limit of the shape parameter D1 is 0.35, the upper limit is 0.45 and the step value is 0.05 so as to yield the numerical values of 0.35, 0.40 and 0.45. In the table of FIG. 9, the numerical range set of each of the shape parameters D1 and D3 includes three numerical values (where D3 is 0.1, 0.11 or 0.12), whereas the numerical range set of the shape parameter D10 includes twelve numerical values, i.e. (0.26:0.32:0.02) yields four numerical values—0.26, 0.28, 0.3 and 0.32, (0.33:0.37:0.01) yields five numerical values—0.33, 0.34, 0.35, 0.36 and 0.37, and (0.38:0.42:0.02) yields three numerical values—0.38, 0.4 and 0.42. The number of possible test component layouts to be generated by the layout generator 202 is thus 3*3*12= 108.

Subsequently, each of the test component layouts is checked to see whether parameter violation has occurred. In this instance, by definition, D8=D6+D2+D1+D4+D7 =0.1+ 0.1+0.35+0.1+0.1=0.75. The user-defined distance value of 0.7 thus violates the definition of the shape parameter D8. Since the shape parameter D8 is defined in terms of the sum of other shape parameters, it is not essential in essence. Therefore, the parameter template 201 can be modified to delete the shape parameter D8 and its definition so that the process of creating the test component layouts can proceed smoothly. Furthermore, in this embodiment, when editing the parameter template 201, the label D8 and the ruler of the shape parameter D8 that encountered a violation in its shape parameter definition will be shown on the monitor 100 to assist the user in making the necessary corrections.

Then, as described in step 311 of FIG. 3, an arrangement rule file 212 can be retrieved to specify the numbers of layouts per row, the distance between neighboring layouts in a row, and the distance between adjacent columns of layouts, and the resulting 108 test component layouts will be shown on the monitor 100, as shown in FIG. 10. The test component layouts can be initially shown in the form of blocks with their associated layout names, as shown in FIG. 11. When one of the blocks is selected, the corresponding test component layout, together with its description text, will be shown on the monitor 100, as shown in FIG. 12.

It has thus been shown that the computer-implemented method and system of this invention can dramatically shorten the process of creating test component layouts for fabrication. Because distances among working shapes are parameterized in the method and system of this invention, new test component layouts can be created with ease by simply defining distance values for the parameters. Therefore, the cost and time for creating test component layouts are greatly reduced. Also, the quality of the test component layouts can be ensured in view of the verifying mechanism. Furthermore, once a parameter template of a test component layout is built, it can be saved as a reusable resource in the sense that even when a new fabrication technology emerges, test component layouts therefor can be readily rendered by merely adjusting the parameter values of the existing parameter template. In summary, the automated method and system of this invention not only minimizes the effect of human error, but also renders an excellent control environment to save manufacturing cost and time.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A computer-implemented method for creating a plurality of integrated circuit (IC) component layouts, each corresponding to a separate one of a plurality of IC components, wherein each IC component layout describes how its corresponding IC component is to be formed within an integrated circuit, the method comprising the steps of:
   a. storing a reference component layout having a plurality of dimensions;
   b. defining a plurality of shape parameters for the component layout, wherein each shape parameter is a variable representing a separate corresponding one of the dimensions of the reference component layout;
   c. receiving first data defining a range of values for at least one of the shape parameters; and
   d. automatically creating a separate IC component layout corresponding to each of a plurality of differing shape parameter values within said range of values, each IC component layout being a modified version of the reference component layout wherein a dimension corresponding to said one of the shape parameters is of length determined by that IC component layout's corresponding shape parameter value.

2. The computer-implemented method in accordance with claim 1
   wherein the first data also defines values of others of said shape parameters, and
   wherein dimensions of IC component layouts created at step d corresponding to said others of said shape parameters are determined by the values of said others of said shape parameters defined by the first data.

3. The computer-implemented method in accordance with claim 2 furthering comprising the step of:
   e. receiving second data defining a default value for each shape parameter,
   wherein in each IC component layout created at step d, the default value for each shape parameter determines the dimension represented by that shape parameter when the first data defines no value for that shape parameter.

4. The computer-implemented method in accordance with claim 3
   wherein at least one shape parameter is defined at step b as a function of more than one other shape parameters, and
   wherein the method further comprises the step of:
   f. processing the first data to determine whether it describes values of shape parameters in a manner inconsistent with any shape parameter's defining function.

5. The computer-implemented method in accordance with claim 3 wherein the method further comprises the step of:
   e. processing the first data to determine whether it describes values of shape parameters in a manner inconsistent with any shape parameter's defining function.
   f. generating an integrated circuit (IC) layout comprising all IC component layouts generated at step d, wherein input data controls positions of the IC component layouts included in the IC layout,
   wherein step b comprises the substeps:
      b1. receiving user input naming the shape parameters;
      b2. displaying a representation of the reference component layout;
      b3. receiving user input selecting one of the shape parameters;

b4. receiving user input selecting a dimension of the displayed representation of the reference component layout;

b5. defining the shape parameter selected at step b3 representing the dimension of the reference component layout selected at step b4; and b6. receiving user input defining another of the shaped parameters named at step b1 as a function of at least one other of the shape parameters named at step b1.

6. The computer-implemented method in accordance with claim 5 wherein the reference component layout comprises a plurality of polygonal working shapes, each having a plurality of edges, wherein at least one of the shape parameters represents a distance between two edges of one of the polygonal working shapes, and wherein at least one other of the shape parameters represents a distance between edges of separate ones of the of polygonal shapes.

7. The computer-implemented method in accordance with claim 1 wherein at least one shape parameter is defined at step b as a function of at least one other of the shape parameters.

8. The computer-implemented method in accordance with claim 7 wherein the method further comprises the step of:

e. processing the first data to determine whether it describes values of shape parameters in a manner inconsistent with any shape parameter's defining function.

9. The computer-implemented method in accordance with claim 1 further comprising the step of:

e. generating an integrated circuit (IC) layout comprising all IC component layouts generated at step d.

10. The computer-implemented method in accordance with claim 9 wherein input data controls positions of the test component layouts included in the IC layout generated at step e.

11. The method in accordance with claim 1 wherein step b comprises the substeps:

b1. receiving user input naming the shape parameters;

b2. displaying a representation of the reference component layout;

b3. receiving user input selecting one of the shape parameters, b4. receiving user input selecting a dimension of the displayed representation of the reference component layout;

b5. defining the shape parameter selected at step b3 as representing the dimension of the reference component layout selected at step b4.

12. The computer-implemented method in accordance with claim 9 wherein step b further comprises the substeps of:

b6. receiving user input defining another of the shaped parameters named at step b1 as a function of at least one other of the shape parameters named at step b1.

13. The computer-implemented method in accordance with claim 1 wherein the reference component layout comprises a plurality of polygonal working shapes, each having a plurality of edges, and wherein at least one of the shape parameters represents a distance between two edges of one of the polygonal working shapes.

14. The computer-implemented method in accordance with claim 1 wherein at least one other of the shape parameters represents a distance between edges of separate ones of the of polygonal shapes.

15. The computer-implemented method in accordance with claim 1 further comprising the step of:

e. displaying a representation of the reference component layout including a ruler referencing a dimension represented by one of the shape parameters and including a label referencing that shape parameter.

16. The computer-implemented method in accordance with claim 15 wherein the ruler is displayed at step e in response to user input selecting the shape parameter representing the dimension referenced by the ruler.

17. The computer-implemented method in accordance with claim 1 wherein the data received at step c defines the plurality of differing values for one of the shape parameters by indicating a lower limit, an upper limit of a range of values and a step size by which the differing values occur between the upper and lower limits.

18. The computer-implemented method in accordance with claim 1 further comprising the step of:

e. defining a plurality of distance variables, wherein each of said shape parameters is defined at step b as a function of at least one of said distance variables.

19. The computer-implemented method in accordance with claim 18 wherein the first data defines said range of values of said at least one of the shape parameters by defining a range of values for one of said distance variables of which said at least one of said shape parameters is defined as a function.

20. The computer-implemented method in accordance with claim 1 where the IC components are test components.

21. A computer-implemented method for creating a IC component layout describing how a IC component is to be formed within an integrated circuit, the method comprising the steps of:

a. storing a reference component layout having a plurality of dimensions;

b. establishing a plurality of distance variables, c. defining each of a plurality of shape parameters as a function of at least one of the distance variables, wherein each shape parameter represents a separate corresponding one of the dimensions of the reference component layout;

d. receiving first data defining value of at least one of the distance variables;

e. determining a value of at least one of the shape parameters in accordance with that shape parameter's function defined at step c and with the value of said at least one of the distance variables, and f. automatically creating the IC component layout as a version of the reference component layout having a dimension corresponding to said one of the shape parameters of length determined by the value of that shape parameter determined at step e.

22. The computer-implemented method in accordance with claim 21 wherein at least one of the shape parameters is a function of a plurality of distance variables.

23. The computer-implemented method in accordance with claim 21 wherein step c comprises the substeps:

c1. receiving user input naming the shape parameters, c2. displaying a representation of the reference component layout;

c3. receiving user input selecting one of the shape parameters, c4. receiving user input selecting a dimension of the displayed representation of the reference component layout;

c5. defining the shape parameter selected at step c3 as representing the dimension of the reference component layout selected at step c4, and c6. receiving user input defining each of the shape parameters named at step c1 as a function of at least one of the distance variables defined at step b.

24. The computer-implemented method in accordance with claim 23 wherein step b comprises receiving user input naming the distance variables.

25. An apparatus for creating a plurality of IC component layouts, each corresponding to a separate one of a plurality of IC components, wherein each IC component layout describes how its corresponding IC component is to be formed within an integrated circuit, the apparatus comprising:

first means for storing a reference component layout and a parameter template defining a plurality of shape parameters, wherein each shape parameter represents a separate corresponding dimension of the reference component layout, and second means for receiving data defining a plurality of differing values for one of the shape parameters defined by the parameter template, and for processing the reference component layout, the parameter template and the received data to automatically create a separate IC component layout corresponding to each value of the plurality of differing values defined by the received data, wherein each created IC component layout is a modified version of the reference component layout wherein a dimension represented by said one of the shape parameters is determined by the corresponding value of that shape parameter.

26. The apparatus in accordance with claim 25 further comprising third means for displaying a representation of each IC component layout.

27. The apparatus in accordance with claim 25 wherein the second means processes the reference component layout and user input selecting dimensions of the reference component layout to generate the parameter template stored by the first means.

28. The apparatus in accordance with claim 25 wherein the IC components are test components.

* * * * *